US008664706B2

(12) United States Patent
Pan et al.

(10) Patent No.: US 8,664,706 B2
(45) Date of Patent: Mar. 4, 2014

(54) CURRENT IN ONE-TIME-PROGRAMMABLE MEMORY CELLS

(75) Inventors: Shanjen "Robert" Pan, Allen, TX (US); Allan T. Mitchell, Heath, TX (US); Weidong Tian, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/528,250

(22) Filed: Jun. 20, 2012

(65) Prior Publication Data

US 2013/0143376 A1  Jun. 6, 2013

Related U.S. Application Data

(62) Division of application No. 13/312,304, filed on Dec. 6, 2011.

(51) Int. Cl.
*H01L 29/76* (2006.01)
*H01L 29/94* (2006.01)

(52) U.S. Cl.
USPC ............ 257/298; 257/288; 257/296; 257/315

(58) Field of Classification Search
USPC ................ 438/296, 257; 365/185.14, 185.05, 365/185.1; 257/288, 296, 298, 315, 341, 257/343, 368
See application file for complete search history.

(56) References Cited

U.S. PATENT DOCUMENTS

| | | | |
|---|---|---|---|
| 5,753,961 A * | 5/1998 | Tsuchiaki | 257/510 |
| 6,295,226 B1 * | 9/2001 | Yang | 365/185.01 |
| 6,593,158 B1 * | 7/2003 | Takahashi | 438/18 |
| 6,809,006 B2 * | 10/2004 | Kim et al. | 438/433 |
| 7,244,651 B2 | 7/2007 | Wu et al. | |
| 2002/0022326 A1 * | 2/2002 | Kunikiyo | 438/296 |
| 2004/0029398 A1 * | 2/2004 | Lee et al. | 438/774 |
| 2004/0235246 A1 * | 11/2004 | Wu et al. | 438/257 |
| 2009/0189202 A1 * | 7/2009 | Baptiste | 257/288 |

OTHER PUBLICATIONS

Goto et al., "A Triple Gate Oxide CMOS Technology Using Fluorine Implant for System-on-a-Chip", Digest of Technical Papers: 2000 Symposium on VLSI Technology (IEEE, 2000), pp. 148-149.
Chung et al., "Performance and Reliability Evaluations of P-Channel Flash Memories with Different Programming Schemes", Tech. Digest of the 1997 Electron Devices Meeting (IEEE, 1997), pp. 295-298.
Lin et al., "The Effect of Flouroine on MOSFET Channel Length", Electron Device Letters, vol. 14, No. 10 (IEEE, 1993), pp. 469-471.

* cited by examiner

*Primary Examiner* — George Fourson, III
*Assistant Examiner* — Wilner Jean Baptiste (74) *Attorney, Agent, or Firm* — Rose Alyssa Keagy; W. James Brady; Frederick J. Telecky, Jr.

(57) ABSTRACT

A method of fabricating a one-time programmable (OTP) memory cell with improved read current in one of its programmed states, and a memory cell so fabricated. The OTP memory cell is constructed with trench isolation structures on its sides. After trench etch, and prior to filling the isolation trenches with dielectric material, a fluorine implant is performed into the trench surfaces. The implant may be normal to the device surface or at an angle from the normal. Completion of the cell transistor to form a floating-gate metal-oxide-semiconductor (MOS) transistor is then carried out. Improved on-state current ($I_{on}$) results from the fluorine implant.

6 Claims, 6 Drawing Sheets

CURRENT IN ONE-TIME-PROGRAMMABLE MEMORY CELLS

CROSS-REFERENCE TO RELATED APPLICATIONS

This application is a division of application Ser. No. 13/312,304, filed Dec. 6, 2011, the content of which is hereby incorporated by reference.

STATEMENT REGARDING FEDERALLY SPONSORED RESEARCH OR DEVELOPMENT

Not applicable.

BACKGROUND OF THE INVENTION

This invention is in the field of solid-state memories. Embodiments of this invention are directed to metal-oxide-semiconductor (MOS) one-time-programmable (OTP) memory cells and methods of constructing the same.

Electrically-programmable memory has been a staple form of solid-state memory for a number of years. Various forms of electrically-programmable memory are well-known in the art, including electrically-programmable read-only memory (EPROM) that is erasable by ultraviolet light, electrically-erasable programmable read-only memory (EEPROM), which is also referred to as electrically-alterable programmable read-only memory (EAPROM), "flash" EEPROM in which blocks of memory cells can be erased in a single erase operation, and the like. In general, electrically-programmable solid-state memory is attractive because of its non-volatility, in that the stored contents remain stored after power has been removed from the memory device. As such, electrically-programmable solid-state memory is often used to store program instructions, configuration data, and other information that is required or useful to an integrated circuit upon power-up. Flash EEPROM is now also often used as non-volatile data storage, for example in portable audio players, smartphones, tablet computers, and the like.

One class of electrically-programmable solid-state memory that is now commonplace is referred to as "one-time programmable", or "OTP", memory. By virtue of its construction, OTP memory cells cannot be erased once programmed, and hence are "one-time programmable". A conventional OTP memory cell typically consists of a metal-oxide-semiconductor (MOS) transistor, with a floating gate electrode (i.e., a gate electrode that is not electrically connected to any other node in the integrated circuit). In manufacture, the unprogrammed state of the OTP cell, in which no charge is trapped on the floating gate electrode, is enforced by ultraviolet exposure or the like. Programming of an OTP cell is performed by driving or pulsing a relatively large drain-to-source voltage at the transistor, resulting in channel hot carrier (CHC) conduction to the floating gate. The carriers (holes or electrons, as the case may be) that become trapped at the floating gate apply a gate bias to the transistor. Typically, this mechanism has a self-limiting effect during programming. After programming, sensing of the data state of the memory cell is performed by applying a drain-to-source voltage at a "read" level (lower than the programming voltage); the resulting source-drain current is relatively high (current $I_{on}$) for programmed cells, and relatively low (current $I_{off}$) for cells that were not programmed. The ratio of $I_{on}/I_{off}$ is typically several orders of magnitude, with $I_{on}$ typically on the order of microamperes and $I_{off}$ typically on the order of picoamperes. A high $I_{on}/I_{off}$ ratio is facilitates data read speed, and increases noise margin. Typically, OTP cell transistors are constructed with a channel length on the order of the minimum for the integrated circuit, for chip area efficiency.

Techniques for increasing the $I_{on}/I_{off}$ ratio of OTP memory cells are known in the art. One technique is simply to increase the channel width of the memory cell transistor to increase its programmed state current $I_{on}$, but this necessarily increases the chip area required to realize the OTP array, especially if the number of memory cells in the array is significant. Other conventional approaches for increasing the programmed state current (i.e., $I_{on}$) of the OTP memory cell require undesirable increases in programming voltage and programming time, as described in U.S. Pat. No. 7,244,651, commonly assigned herewith and incorporated hereinto by this reference. By way of further background, this U.S. Pat. No. 7,244,651 itself describes another technique for increasing the $I_{on}/I_{off}$ ratio, specifically by decreasing the leakage (i.e., $I_{off}$) current.

By way of further background, the ion implantation of fluorine into the active regions of MOS transistors is known. Lin et al., "The Effect of Fluorine on MOSFET Channel Length", *Elec. Device Letters*, Vol. 14, No. 10 (IEEE, October 1993), pp. 469-71, incorporated herein by reference, describes the implantation of fluorine into the source and drain regions of MOS transistors (i.e., specifically into the "lightly-doped drain" implanted regions) after formation of the polysilicon gate electrode; this paper reports that the fluorine results in a smaller channel length reduction, by retarding phosphorous lateral diffusion. Goto et al., "A Triple Gate Oxide CMOS Technology Using Fluorine Implant for System-on-a-Chip", *Digest of Technical Papers: 2000 Symposium on VLSI Technology*, Paper 15.3 (IEEE, 2000), pp. 148-49, describes the implantation of fluorine into the low power CMOS active region, prior to formation of the gate oxide and gate electrode, to reduce gate leakage current.

BRIEF SUMMARY OF THE INVENTION

Embodiments of this invention provide a method of fabricating one-time programmable (OTP) memory cells, and memory cells so fabricated, in which the programmed state (i.e., "on") current is increased without requiring increased programming voltage or programming time.

Embodiments of this invention provide such a method and memory cells in which the programmed state current is increased without also increasing the unprogrammed state (i.e., "off") current.

Embodiments of this invention provide such a method and memory cells in which the read drive current is increased, and thus the read access time reduced, for a given memory cell transistor size.

Embodiments of this invention provide such a method and memory cells in which the memory cell transistor size can be reduced without adversely affecting the read drive current.

Embodiments of this invention provide such a method and memory cells in which the electrical characteristics other transistors, such as logic transistors and the like, are essentially unaffected by the construction of the OTP memory cell transistors.

Other objects and advantages of this invention will be apparent to those of ordinary skill in the art having reference to the following specification together with its drawings.

Embodiments of this invention may be implemented into an integrated circuit including one-time programmable (OTP) memory cells constructed as metal-oxide-semiconductor (MOS) transistors with floating gates, in which the source and drain regions are isolated from neighboring cells by shallow trench isolation dielectric structures. A masked fluorine implant into the trenches of the isolation structures, prior to the filling of those trenches with dielectric material, is performed in the OTP memory array area. Increased "on" state current for the programmed state of the memory cell is attained, without impacting the unprogrammed "off" state current of the transistor, or the device size.

BRIEF DESCRIPTION OF THE SEVERAL VIEWS OF THE DRAWING

FIG. 2a is a plan view.

DETAILED DESCRIPTION OF THE INVENTION

This invention will be described in connection with one or more of its embodiments, namely as implemented into a one-time-programmable (OTP) non-volatile memory cell in the form of a p-channel metal-oxide-semiconductor (MOS) transistor, as it is contemplated that this invention will be especially beneficial when realized in that form. However, it is contemplated that other non-volatile memory cells and similar structures, of other types and forms, may also benefit from this invention. Accordingly, it is to be understood that the following description is provided by way of example only, and is not intended to limit the true scope of this invention as claimed.

Figure 1A:
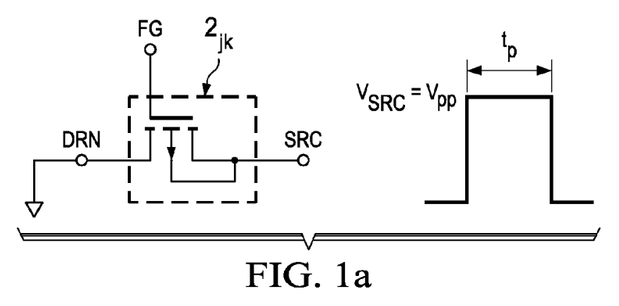
FIGS. 1a and 1b are electrical diagrams, in schematic form, of a one-time programmable (OTP) memory cell, into which embodiments of this invention may be incorporated.
Figure 1B:
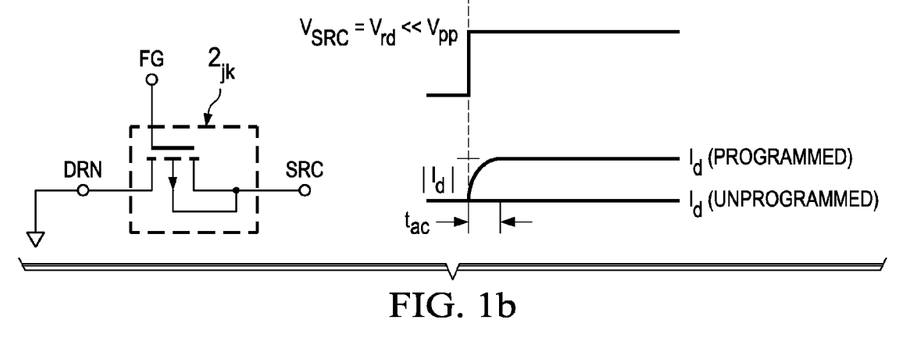

FIGS. 1a and 1b illustrate the electrical arrangement and operation of a p-channel MOS transistor as OTP memory cell $2_{jk}$, as will be realized according to embodiments of this invention. As is well known in the art, OTP memory cell $2_{jk}$ will typically be realized in an array of memory cells, for example to serve as program memory (including "boot" memory) for a microprocessor or other processing logic; in that arrangement, cell $2_{jk}$ will reside in row j and column k of that memory array. Alternatively, cell $2_{jk}$ may reside within a register (i.e., as one bit of a single data word), such as a configuration register for an integrated circuit, or to set a trim level for an analog circuit.

In this example, as mentioned above, memory cell $2_{jk}$ is realized as a single p-channel MOS transistor in this example. As such, the transistor of cell $2_{jk}$ has a source, drain, and gate; the source and body node of this transistor are connected to node SRC, which is a controllable voltage from within the integrated circuit within which cell $2_{jk}$ is realized. The drain of the transistor of cell 2jk is connected to node DRN, which is at ground in this example, and its gate (at node FG), is electrically floating. In this unprogrammed ("virgin") state, typically enforced at manufacture by exposure of cell $2_{jk}$ to ultraviolet light, few electrons are trapped at floating gate FG (which, if implemented as polycrystalline silicon, will typically be doped p-type). For cell $2_{jk}$ in this unprogrammed state, its transistor will be in an "off" state, such that the source/drain current under a source/drain bias at a "read" level will essentially consist only of leakage current (such current referred to as current "$I_{off}$").

Figure 2A:
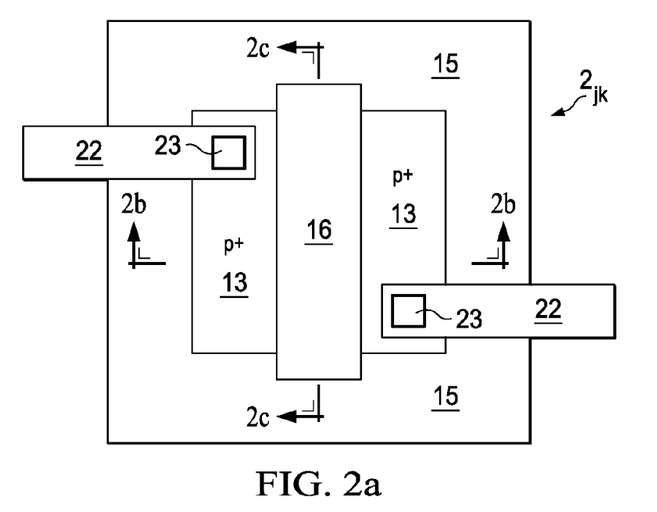

FIG. 1a illustrates the bias conditions under which cell $2_{jk}$ is programmed. In this example, one or more voltage pulses are applied to node SRC, with node DRN biased to ground as shown. The voltage $V_{SRC}$ at node SRC is raised to a high voltage $V_{pp}$ (i.e., a voltage significantly above the nominal source/drain voltage for transistor operation) for a duration $t_p$ of the programming pulse. This programming voltage $V_{pp}$ pulse causes charge to become trapped at the floating gate of cell $2_{jk}$. One example of a known programming mechanism for floating-gate p-channel MOS transistors is channel-hot-hole impact ionization-induced channel hot-electron injection. According to that mechanism, the high source-drain bias of the programming pulse causes some holes to be conducted at high energy from source to drain. Impact of some fraction of those high-energy holes with the lattice releases electrons with sufficient energy to become injected into the floating gate electrode. Upon a sufficient number of electrons becoming injected into the gate electrode during the programming pulse, a p-type channel will form (i.e., the transistor will turn on), allowing significant source-drain current via the channel and self-limiting the impact ionization mechanism. Of course, because the gate electrode is floating, electrons that are injected into the gate electrode remain trapped on the gate after the programming pulses are over. A read of cell $2_{jk}$ is illustrated in FIG. 1b by the application of a nominal operating bias voltage $V_{RD}$ at source node SRC relative to drain node DRN. As shown in FIG. 2a, if cell $2_{jk}$ is not programmed, only leakage current $I_{off}$ will conduct between source and drain; if cell $2_{jk}$ is programmed, on-state source/drain current $I_{on}$ will conduct at access time $t_{ac}$. A sense amplifier or other circuitry coupled to source node SRC of memory cell $2_{jk}$ (when addressed) determines the stored data state based on this difference in read current.

As mentioned above, the performance and reliability of OTP memory cells such as cell $2_{jk}$ increases with higher values of the $I_{on}/I_{off}$ ratio. The speed at which the data state can be sensed increases with high $I_{on}/I_{off}$, particularly at higher $I_{on}$ levels. In addition, the noise margin and thus the reliability of the sensing operation is improved under those conditions. Embodiments of this invention are intended to improve the $I_{on}/I_{off}$ ratio, particularly by increasing the programmed state current $I_{on}$ without corresponding increase in the leakage current $I_{off}$.

Figure 2B:
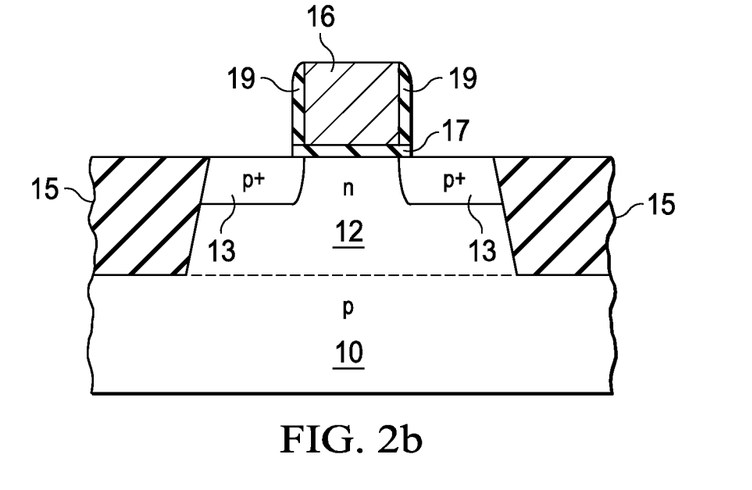
FIGS. 2b and 2c are cross-sectional diagrams, of an OTP memory cell constructed according to embodiments of the invention.
Figure 2C:
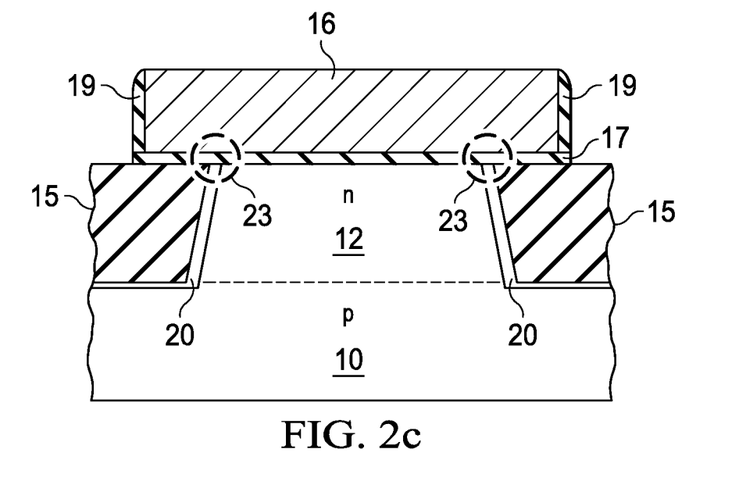

FIGS. 2a through 2c illustrate the construction of cell $2_{jk}$ in an integrated circuit according to an embodiment of the invention. In the plan view of FIG. 2a, isolation dielectric 15 surrounds an active semiconductor region at which source/drain diffused regions 13 are present on opposing sides of polysilicon floating gate electrode 16. Electrical contact to source/drain regions 13 is made by corresponding metal conductors 22, via contact openings 23 through an interlevel dielectric layer (not shown) in the conventional manner. No such electrical contact is made to gate electrode 16 by any other element in the integrated circuit, and as such it is electrically isolated (i.e., "floating"). As shown in FIG. 2a, both ends of floating gate electrode 16 overlap onto isolation dielectric 15, ensuring that the transistor channel extends the full distance between isolation dielectric structures 15.

While isolation dielectric structure 15 is shown in FIG. 2a as surrounding the active region of cell $2_{jk}$, thus isolating both the source and drain regions from the active regions of other transistors and memory cells, separate isolation dielectric structures 15 can alternatively be placed on either side of the transistor, for example if neighboring memory cells $2_{jk}$ share a common drain region (connected to ground). In addition, connection of the body node of the transistor of cell $2_{jk}$ to ground may be made by way of a separate contact and metal or other conductor. Further in the alternative, of course, cell $2_{jk}$ may be realized as an n-channel MOS transistor if desired.

FIG. 2b illustrates cell $2_{jk}$ in cross-section, in a direction perpendicular to gate electrode 16. As shown in FIG. 2b, cell $2_{jk}$ is formed at a semiconductor surface of a body that includes p-type substrate 10 in this example. Isolation dielectric 15 are formed as so-called "shallow trench isolation" structures, and as such are recessed into the surface of substrate 10 and essentially flush with the surface of the active region between those isolation dielectric structures 15. In this embodiment of the invention, cell $2_{jk}$ is a p-channel MOS transistor formed into n-type well 12, which is disposed at an upper portion of substrate 10 between isolation dielectric structures 15. Polysilicon gate electrode 16 is disposed above the surface of the active region of well 12, separated therefrom by gate dielectric 17. Heavily-doped p-type source/drain regions 13 are disposed at the surface of well 12 on either side of gate electrode 16, in the well-known self-aligned fashion. Sidewall dielectric filaments 17 along the sides of gate electrode 16 may be used to define "lightly-doped drain" extensions of source/drain regions 13, and other types of graded or pseudo-graded junctions. The n-type portion of well 12 at its surface, between source/drain regions 13 and underlying gate electrode 16, is the channel region of the transistor of cell $2_{jk}$.

FIG. 2c illustrates cell $2_{jk}$ in cross-section, in a direction along gate electrode 16. As such, source/drain regions 13 are not visible in FIG. 2c; rather, the channel region in n-well 12 abuts isolation dielectric structures 15 on both ends, due to the overlap of gate electrode 16 and gate dielectric 17 onto isolation dielectric structures 15, as shown.

According to embodiments of this invention, isolation dielectric structures 15 are formed by way of etching trenches into substrate 10, followed by deposition of a dielectric material such as silicon dioxide into those trenches. This method of forming isolation structures for transistors in integrated circuits is known in the art. According to embodiments of this invention, however, fluorine ions are implanted into the trenches etched into substrate 10, prior to the deposition of the filler dielectric material to complete isolation dielectric structures 15. The implanted fluorine ions are contemplated to affect the portions of the underlying silicon, for example at regions 20 as shown in FIG. 2c. It is further believed, in connection with this invention, that gate dielectric 17 tends to be thinner along the edges of trenches 15 because of these implanted regions 20, for example at locations 23 shown in FIG. 2c. It is further believed that this thinning of gate dielectric 17 at locations 23 improves the programming efficiency of cell $2_{jk}$, thus resulting in the improved programmed-state current $I_{on}$.

Figure 3:
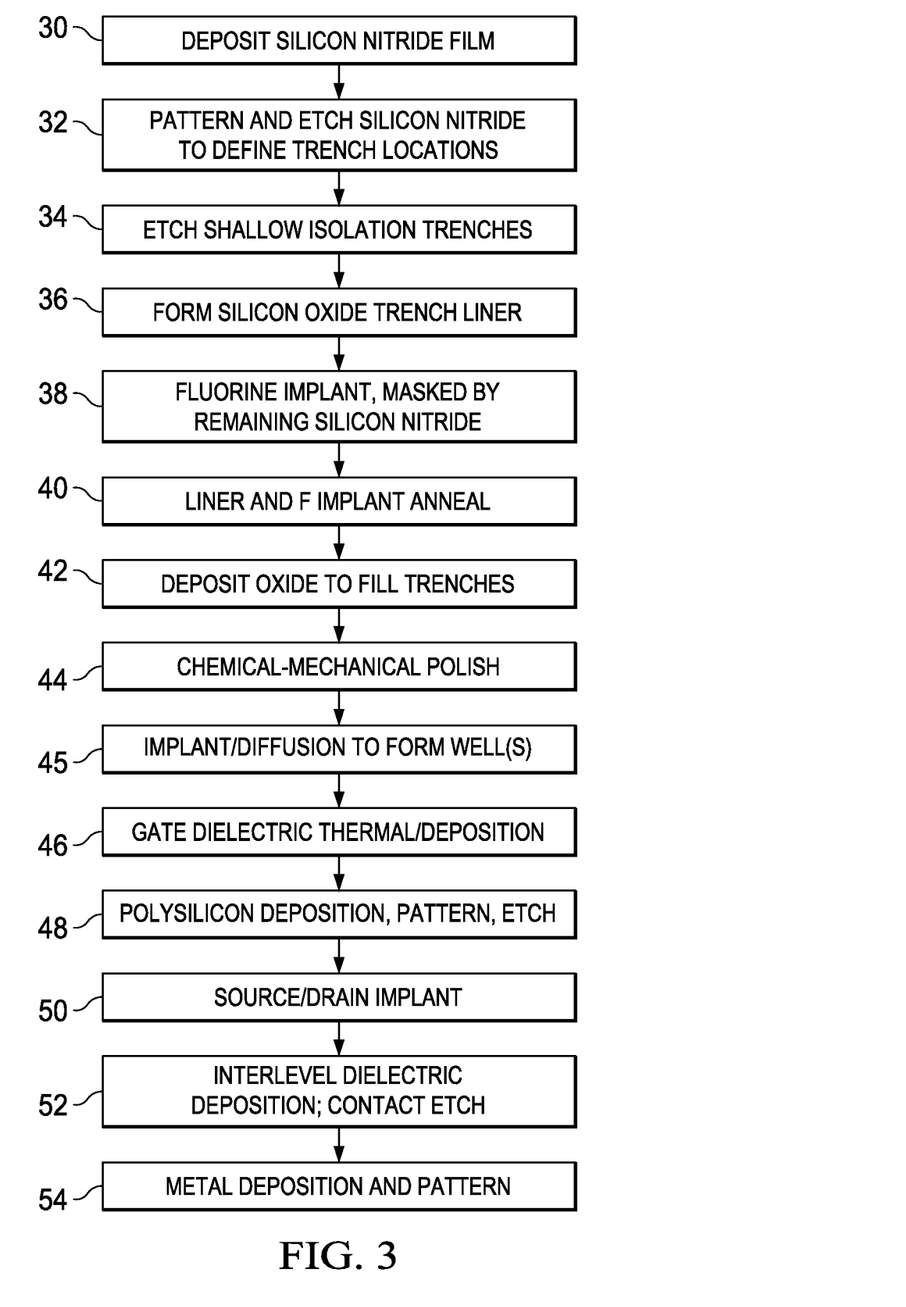
FIG. 3 is a flow diagram illustrating a method of fabricating the OTP memory cell of FIGS. 2a through 2c according to an embodiment of the invention.

Referring now to FIG. 3 in combination with the cross-sectional views of FIGS. 4a through 4h, a method of fabricating OTP cells according to an embodiment of this invention will now be described in detail. It is of course contemplated that variations of and alternatives to the method described herein will become apparent to those skilled in the art having reference to this specification, such variations and alternatives being within the scope of this invention as claimed. And while this method of fabrication will be described in connection with a single instance of cell $2_{jk}$, it is of course contemplated that multiple such cells $2_{jk}$ will be simultaneously and similarly formed at the surface of the integrated circuit structure, for multiple integrated circuits in the same semiconductor wafer, as fundamental in the art.

Figure 4A:
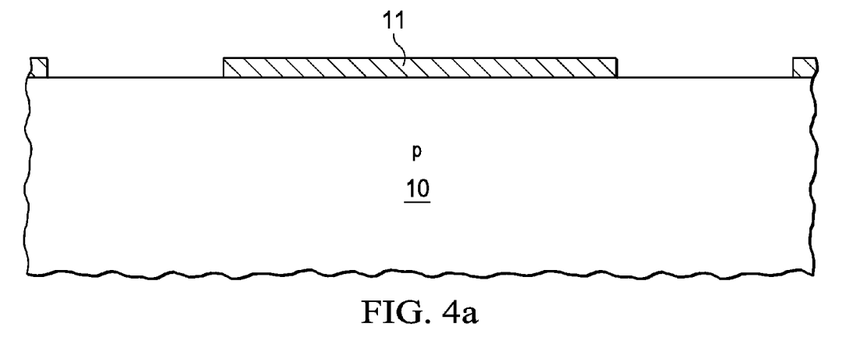
FIGS. 4a through 4h are cross-sectional views of the memory cell of FIGS. 2a through 2c, at various stages in the fabrication process of FIG. 3, according to that embodiment of the invention.

In this embodiment of the invention, as described above in connection with FIGS. 2a through 2c, cell $2_{jk}$ is formed at a surface of p-type silicon substrate 10. It is of course contemplated that other substrate types, including n-type or intrinsic substrates, silicon-on-insulator substrate structures, and the like may alternatively be used. Prior to the process steps shown in FIG. 3, it is contemplated that the appropriate manufacturing processes will have been performed according to the desired process flow, leading up to the formation of isolation structures at the surface of substrate 10 and the corresponding definition of active regions. In process 30, a layer of silicon nitride is deposited overall, preferably to such a thickness as suitable for serving as a mask to the trench etch defining the locations of isolation dielectric structures 15. In process 32, this silicon nitride layer is photolithographically patterned and etched, exposing the surface of substrate 10 at those locations at which trenches are to be etched, and conversely protecting those locations of the surface of substrate 10 that are to become the active regions. FIG. 4a illustrates, in cross-section, the integrated circuit structure at this point in the fabrication process. As shown in FIG. 4a, silicon nitride layer 11 has been photolithographically patterned and etched as desired, exposing some portions of the surface of substrate 10 and remaining in place over others.

Figure 4B:
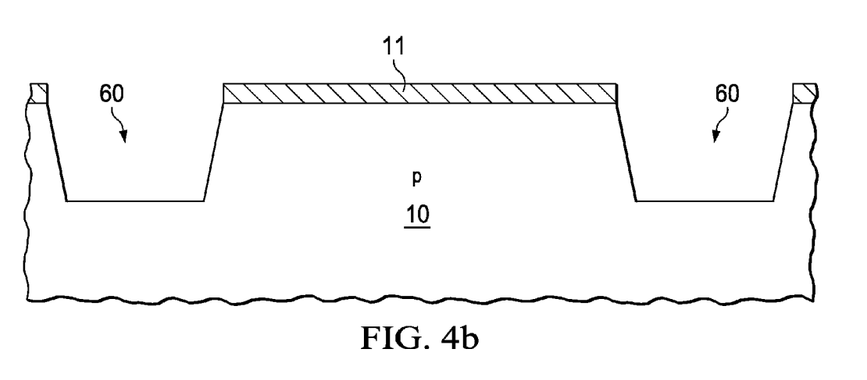
Figure 4C:
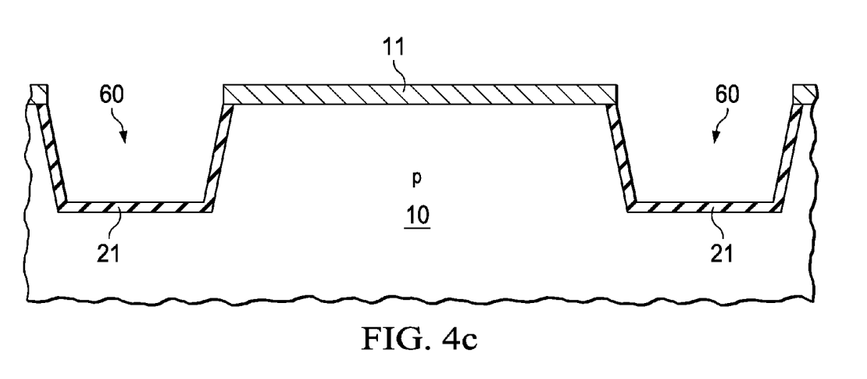

In process 34, substrate 10 is etched to define trenches at those locations exposed by silicon nitride layer 11. The result of etch process 34 is shown in FIG. 4b, with trenches 60 etched into the surface of substrate 10 at the exposed locations. Typically, it is contemplated that trench etch process 34 will be performed by a type of plasma or "dry" etch, such that the profile of trenches 60 can be controlled as desired. In process 36, a liner layer of silicon dioxide is formed within trenches 60, for example by thermal oxidation of the exposed silicon surface within those trenches 60. Silicon nitride layer 11 at the protected surfaces of substrate 10 prevents thermal oxidation at those locations, as known in the art. FIG. 4c illustrates liner layer 21 within trenches 60; liner layer 21 is relatively thin as compared with the depth of trenches 60, as conventional in trench isolation processes.

Figure 4D:
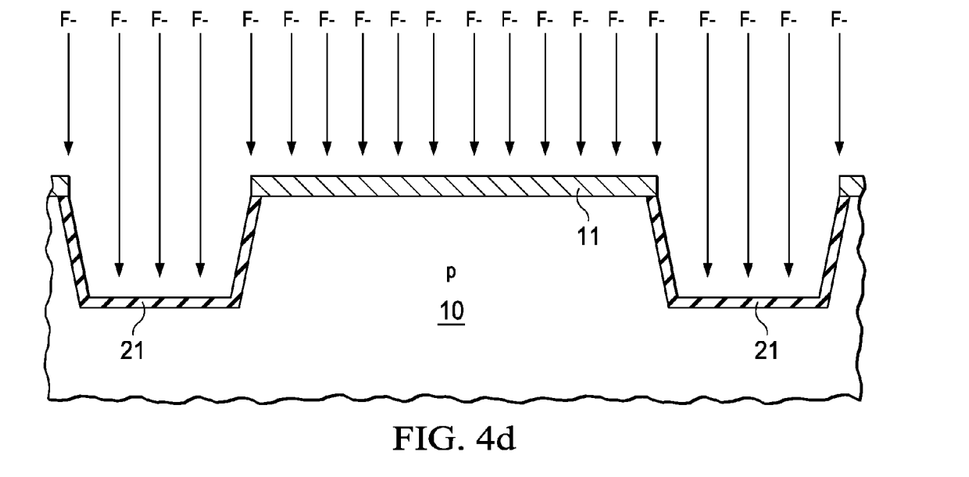
Figure 4E:
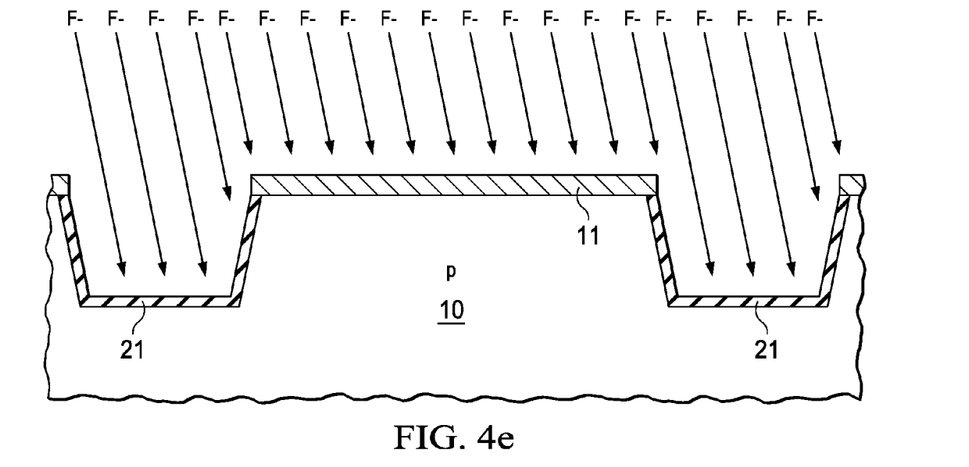
Figure 4F:
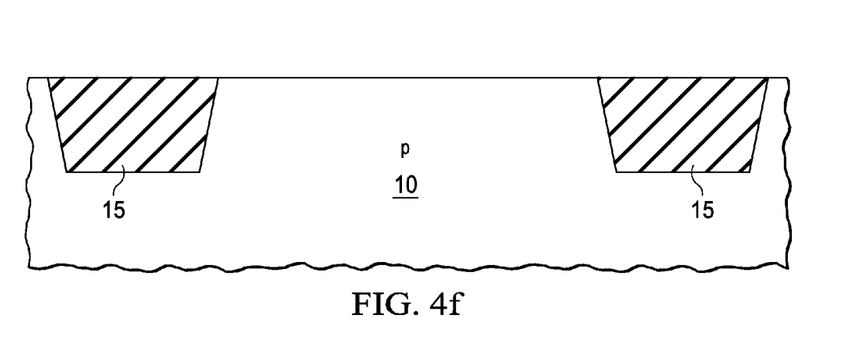

In this embodiment of the invention, trenches 60 are subjected to an ion implantation of fluorine ions in process 38. This fluorine implant is of sufficient energy to penetrate and pass through liner layer 21 when present, but is generally blocked by nitride layer 11 from impacting the active surface at those locations. The fluorine implant of process 38 may be generally in a normal direction to the surface of substrate 10 as shown in FIG. 4d, or may be at an angle (e.g., 45°) from the normal as shown in FIG. 4e, or may be a combination of the two (i.e., two separate implants, with one angled). It is contemplated that implant process 38 will implant fluorine at a dose on the order of $1 \times 10^{15}/cm^2$, at an energy on the order of 5 to 10 keV. As known in the art, the angled implant is contemplated to be performed in a rotated fashion, to uniformly implant the fluorine into the structure. As will be discussed below, it has been observed that the angled implant can enhance the beneficial effects of the fluorine implant on the electrical performance of cell $2_{jk}$.

Following the fluorine implant of process 38, the structure is annealed at a high temperature for a selected duration, as suitable for liner layer 21 and for the implanted fluorine, in process 40. This anneal may be a rapid thermal anneal (RTA) as now commonly used in the industry, or alternatively a conventional furnace anneal in an inert ambient. Following this liner and post-implant anneal, trenches 60 are filled with the dielectric material to serve as the isolation structure in process 40. For example, process 40 may be performed by way of the chemical vapor deposition of silicon dioxide. The deposited insulator is contemplated to be sufficient to fill trenches 60 and extend above the surface of the structure (i.e., above the surface of silicon nitride layer 11). In process 42, according to this embodiment of the invention, chemical-mechanical polishing (CMP) is used to planarize the surface of the dielectric deposited in process 40 with the rest of the structure. It is contemplated that this CMP may also serve to remove silicon nitride layer 11 from the active surface of substrate 10, resulting in the structure shown in FIG. 4f in which isolation dielectric structures 15 have a top surface that is essentially coplanar with the semiconducting surface of substrate 10 as shown. Of course, other approaches to removing silicon nitride layer 11 and shaping the top surface of isolation dielectric structures 15 may alternatively be used.

Optional process 45 can then next be performed, to form n-type well 12 at the surface of substrate 10 in the conventional manner, for example by way of implant and anneal. If a twin-well process is being implemented, the appropriate mask and photolithography processes will be included so that well formation process 45 forms n-type wells 12 in those locations at which p-channel MOS transistors are to be formed, and forms p-type wells in those locations at which n-channel MOS transistors are to be formed. If cell $2_{jk}$ is being formed into substrate 10 of the opposite conductivity type (e.g., p-type substrate 10 and n-channel cell $2_{jk}$), then process 45 need not be performed in those locations.

Figure 4G:
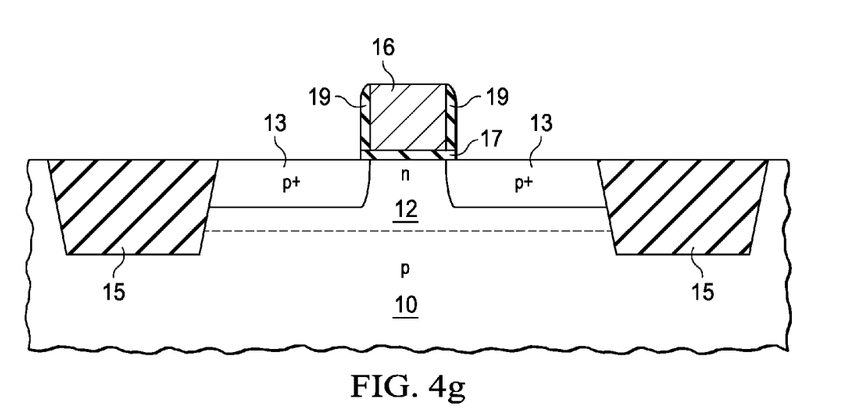
Figure 4H:
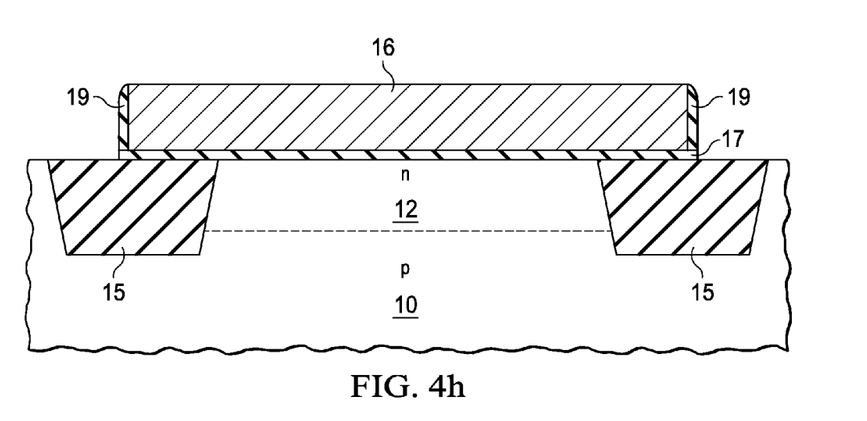

Following process 44 and process 45 (if performed), the transistor of cell $2_{jk}$ is then formed in the conventional manner, beginning with process 46 in which gate dielectric 17 is formed in the conventional manner, for example by thermal oxidation of the surface of substrate 10 or well 12, deposition, or a combination of the two (e.g., an oxide/nitride gate dielectric 17). In process 48, a layer of polysilicon is deposited, patterned, and etched to form gate electrode 16 as shown in FIGS. 2a through 2c, and other gate level structures in the integrated circuit, as conventional in the art. In process 50, source/drain regions 13 are implanted and annealed in the conventional manner to form the source and drain regions of the transistor of cell $2_{jk}$ and other MOS transistors in the integrated circuit. Process 50 also includes the deposition and anisotropic etch of the appropriate material for sidewall filaments 17 as desired, in combination with the particular lightly-doped drain regions and other steps as appropriate for the desired dopant profile. FIGS. 4g and 4h illustrate the construction of cell $2_{jk}$ in cross-section following process 50, in the cross-sectional directions perpendicular to and along the direction of gate electrode 16, respectively.

The construction of the integrated circuit including cell $2_{jk}$ is then completed in the conventional manner, including the deposition of interlevel dielectric material overlying the structures shown in FIGS. 4g and 4h, and the etch of contact openings 23 through that interlevel dielectric layer, at locations as shown in FIG. 2a and elsewhere in the integrated circuit, in process 52. In process 54, metal or other conductive material is then deposited, patterned, and etched in order to form the first level metal conductors including conductors 22 for making contact through contact openings 23 to the source and drain of the transistor of cell $2_{jk}$ as shown in FIG. 2a. Additional metal levels, interlevel dielectric layers, and contact/via openings are similarly performed to fabricate the conductor routing within the integrated circuit as desired for the circuit function. In any case, floating gate electrode 16 of cell $2_{jk}$ remains electrically isolated from all other elements in the integrated circuit in this OTP realization, so that cell $2_{jk}$ in its programmed state will remain programmed. Following manufacture in wafer form, conventional wafer-level test, packaging, and final test processes and the like are performed to complete the integrated circuit.

According to embodiments of this invention, significant improvement in the $I_{on}/I_{off}$ ratio of OTP memory cells is attained, without increasing the leakage current $I_{off}$ in so doing. More specifically, embodiments of this invention result in higher $I_{on}$ current for the OTP memory cells receiving the fluorine implant. This $I_{on}$ improvement has been observed in actual OTP memory cells receiving the fluorine implant according to embodiments of the invention, with improvement of on the order of 5% observed in devices receiving a fluorine implant in the normal direction relative to the surface of the wafer, and improvement of on the order of 15% for devices receiving a two-stage fluorine implant, in which one of the fluorine implants has a nominal angle of incidence of 45°. The $I_{off}$ leakage current for these devices exhibited no change from the average $I_{off}$ current for devices not receiving the fluorine implant.

As mentioned above, it is believed, according to this invention, that this improvement is the result of the fluorine implant along the sides of the isolation dielectric structures causing the gate dielectric to be thinner at the edges of the channel between source and drain of the cell transistor. Noticeable thinning of the gate dielectric has been observed, according to this invention, to an enhanced extent in those devices receiving a two-stage fluorine implant (one implant at a 45° angle from the normal), as compared with those receiving the fluorine implant in the normal direction only. According to this theory, the thinner gate dielectric along those edges facilitates channel hot electron injection during the programming pulse, resulting in more trapped electrons in the floating gate electrode for a given programming pulse (and before the self-limiting of the programming operation). This theory is consistent with the observation, made in connection with this embodiment of the invention, that transistors with larger channel width transistors, and logic or switching transistors with driven (rather than floating) gate electrodes, elsewhere in the same integrated circuit show little or no effect from the fluorine implant. Conversely, it has been observed, in connection with this invention, that smaller floating-gate transistors (i.e., shorter channel width) exhibit the beneficial effect of this invention to a greater extent than do larger floating-gate transistors. Of course, because memory cell transistors in general, and OTP memory cells in particular, are generally fabricated with minimum feature size transistors to minimize chip area (considering the larger number of memory cells in typical memory arrays), this small-transistor benefit of this invention is well-suited for implementation of embodiments of this invention. This theory is also consistent with the observation that the angled implant has been observed to further improve the $I_{on}$ performance even over the normal incidence fluorine implant alone.

The result of the improved $I_{on}/I_{off}$ ratio provided by embodiments of this invention is improved sensing of the data states stored by the OTP memory cells in the circuit. This improved sensing of course improves the noise margin, and thus the reliability, of the OTP memory and its operation. In addition, the increased current $I_{on}$ for programmed cells increases the current drive of addressed memory cells, which improves the access time (i.e., data read speed). This improved read speed can be realized as improved device performance, for OTP cells fabricated at conventional sizes; conversely, the size of the OTP cell can be reduced as a result of the invention, without a reduction in $I_{on}$ current (and thus in data read speed) from that of the larger, conventional, OTP memory cell. Additional flexibility is thus provided to the designer of the OTP memory, who can exploit the invention by improved performance, or reduced chip area. In addition, these benefits can be obtained without requiring an additional photomask or photolithography step in the overall process, and thus with minimal additional cost.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

The invention claimed is:

1. A one-time-programmable (OTP) memory cell at a semiconducting surface of an integrated circuit body, fabricated according to a method comprising the steps of:
    forming one or more isolation trenches into the surface at locations on opposing sides of an active region at the surface;
    forming an implant block layer overlying the active region;
    implanting fluorine ions into the one or more isolation trenches;
    then depositing an insulating material into the one or more isolation trenches to form isolation structures therein;
    forming a gate dielectric layer over the active region;
    forming an isolated gate element overlying the gate dielectric layer at a portion of the active region;
    forming first and second diffusion regions into the active region on opposing sides of the gate element; and
    forming conductors in contact with the first and second diffusion regions.

2. The memory cell of claim 1, wherein the method further comprises:
    chemical mechanical polishing the structure after the step of depositing an insulating material into the first and second isolation trenches, to planarize the surfaces of the isolation structures.

3. The memory cell of claim 2, wherein the chemical-mechanical polishing step also removes the implant block layer.

4. The memory cell of claim 1, wherein the implanting step comprises:
    implanting fluorine ions into the first and second isolation trenches substantially perpendicularly relative to the surface.

5. The memory cell of claim 1, wherein the implanting step comprises:
    implanting fluorine ions into the first and second isolation trenches at a substantial angle from the perpendicular to the surface.

6. The memory cell of claim 1, further comprising:
    after the step of implanting fluorine ions into the first and second isolation trenches, annealing the integrated circuit body.

* * * * *